United States Patent [19]
Chi et al.

[11] Patent Number: 5,808,937
[45] Date of Patent: Sep. 15, 1998

[54] SELF-CONVERGENT METHOD FOR PROGRAMMING FLASH AND EEPROM MEMORY CELLS THAT MOVES THE THRESHOLD VOLTAGE FROM AN ERASED THRESHOLD VOLTAGE RANGE TO ONE OF A PLURALITY OF PROGRAMMED THRESHOLD VOLTAGE RANGES

[75] Inventors: Min-hwa Chi; Albert Bergemont, both of Palo Alto, Calif.

[73] Assignee: National Semiconductor Corporation, Santa Clara, Calif.

[21] Appl. No.: 797,307

[22] Filed: Feb. 7, 1997

Related U.S. Application Data

[63] Continuation-in-part of Ser. No. 782,587, Jan. 13, 1997, abandoned, which is a continuation of Ser. No. 422,146, Apr. 13, 1995, Pat. No. 5,594,685, which is a continuation-in-part of Ser. No. 357,115, Dec. 16, 1994, abandoned.

[51] Int. Cl.$^6$ .................................................. G11C 7/00
[52] U.S. Cl. ............................... 365/185.33; 365/185.03; 365/185.24
[58] Field of Search ................... 365/185.33, 185.03, 365/185.24, 185.27

[56] References Cited

U.S. PATENT DOCUMENTS

| | | | |
|---|---|---|---|
| 4,181,980 | 1/1980 | McCoy ....................................... | 365/45 |
| 4,279,024 | 7/1981 | Schrenk .................................... | 365/203 |
| 4,357,685 | 11/1982 | Daniele et al. ........................... | 365/189 |
| 4,698,787 | 10/1987 | Mukherjee et al. ..................... | 365/185 |
| 4,821,236 | 4/1989 | Hayashi et al. .......................... | 365/185 |
| 4,912,676 | 3/1990 | Paterson et al. .................... | 365/185.16 |
| 5,021,999 | 6/1991 | Kohda et al. ............................. | 365/168 |
| 5,043,940 | 8/1991 | Harari ....................................... | 365/168 |
| 5,187,683 | 2/1993 | Gill ............................................ | 365/185 |
| 5,204,835 | 4/1993 | Eitan ......................................... | 365/185 |
| 5,218,569 | 6/1993 | Banks ................................... | 365/189.01 |
| 5,293,560 | 3/1994 | Harari ....................................... | 365/185 |
| 5,346,842 | 9/1994 | Bergemont et al. ...................... | 437/52 |
| 5,394,362 | 2/1995 | Banks ................................... | 365/189.01 |
| 5,418,743 | 5/1995 | Tomioka et al. ..................... | 365/189.01 |
| 5,422,845 | 6/1995 | Ong ........................................... | 365/185 |
| 5,436,478 | 7/1995 | Bergemont .............................. | 257/316 |
| 5,440,505 | 8/1995 | Fazio et al. ............................... | 365/45 |
| 5,444,663 | 8/1995 | Furuno et al. ........................... | 365/226 |
| 5,477,485 | 12/1995 | Bergemont et al. ............... | 365/185.24 |
| 5,511,021 | 4/1996 | Bergemont et al. ............... | 365/185.03 |
| 5,550,772 | 8/1996 | Gill ..................................... | 365/185.03 |
| 5,557,567 | 9/1996 | Bergemont et al. ............... | 365/185.16 |
| 5,587,949 | 12/1996 | Bergemont et al. ............... | 365/185.24 |
| 5,594,685 | 1/1997 | Bergemont et al. ............... | 365/185.03 |

FOREIGN PATENT DOCUMENTS

| | | | |
|---|---|---|---|
| 60-038881 | 2/1985 | Japan ............................. | H01L 29/78 |
| 63-172471 | 7/1988 | Japan ............................. | H01L 29/78 |

OTHER PUBLICATIONS

U.S. application No. 08/782,587, Bergemont et al., filed Jan. 13, 1997.

Blyth, T. et al., "A Non-Volatile Analog Storage Device Using EEPROM Technology," ISSCC91/Session 11/Emerging Circuit Technologies/Paper TP11.7, Feb. 14, 1991 (3 pages).

Horiguchi, M. et al., "An Experimental Large–Capacity Semiconductor File Memory Using 16–Levels/Cell Storage," IEEE Journal of Solid–State Circuits, vol. 23, No. 1, Feb. 1988, pp. 27–33.

(List continued on next page.)

*Primary Examiner*—Vu A. Le
*Attorney, Agent, or Firm*—Limbach & Limbach L.L.P.

[57] ABSTRACT

The threshold voltage of a FLASH or FLOTOX memory cell set to fall within an erased threshold voltage range is programmed to fall within one of a plurality of programmed threshold voltage ranges by applying a substrate voltage to the substrate material, a drain voltage to the drain region, and one of a plurality of programming voltages to the control gate of the cell. With FLOTOX cells, a select voltage must also be applied to the select gate.

25 Claims, 9 Drawing Sheets

OTHER PUBLICATIONS

Bleiker, C. et al., "A Four–State EEPROM Using Floating–Gate Memory Cells," IEEE Journal of Solid–State Circuits, vol. SC–22, No. 3, Jun. 1987, pp. 460–463.

Saks, N. et al., "Observation of Hot–Hole Injection of NMOS Transistors Using a Modified Floating–Gate Technique," U.S. Government publication (5 pages).

Oyama, K. et al., "A Novel Erasing Technology for 3.3V Flash Memory with 64Mb Capacity and Beyond," 1992 IEEE, IEDM 92, pp. 607–610.

Yamada, S. et al., "A Self–Convergence Erasing Scheme for a Simple Stacked Gate Flash EEPROM," 1991 IEEE, IEDM 91, pp. 307–310.

Takeda, E. et al., "Device Performance Degradation Due to Hot–Carrier Injection at Energies Below the Si–SiO$_2$ Energy Barrier," 1983 IEEE, IEDM 83, pp. 396–399.

Hofmann, K.R. et al., "Hot–Electron and Hole–Emission Effects in Short n–Channel MOSFET's," IEEE Transactions on Electron Devices, vol. ED–32, No. 3, Mar. 1985, pp. 691–699.

Nissan–Cohen, Y., "A Novel Floating–Gate Method for Measurement of Ultra–Low Hole and Electron Gate Currents in MOS Transistors," IEEE Electron Device Letters, vol. EDL–7, No. 10, Oct. 1986, pp. 561–563.

Bez, R. et al., "A Novel Method for the Experimental Determination of the Coupling Ratios in Submicron EPROM and Flash EEPROM Cells," IEEE, IEDM 90, pp. 99–102.

Kubota, Y. et al. "A Proposal of New Multiple–Valued Mask–ROM Design," IEICE Trans. Electron, vol. E77–C. No. 4, Apr. 1994, pp. 601–606.

Figure 3:
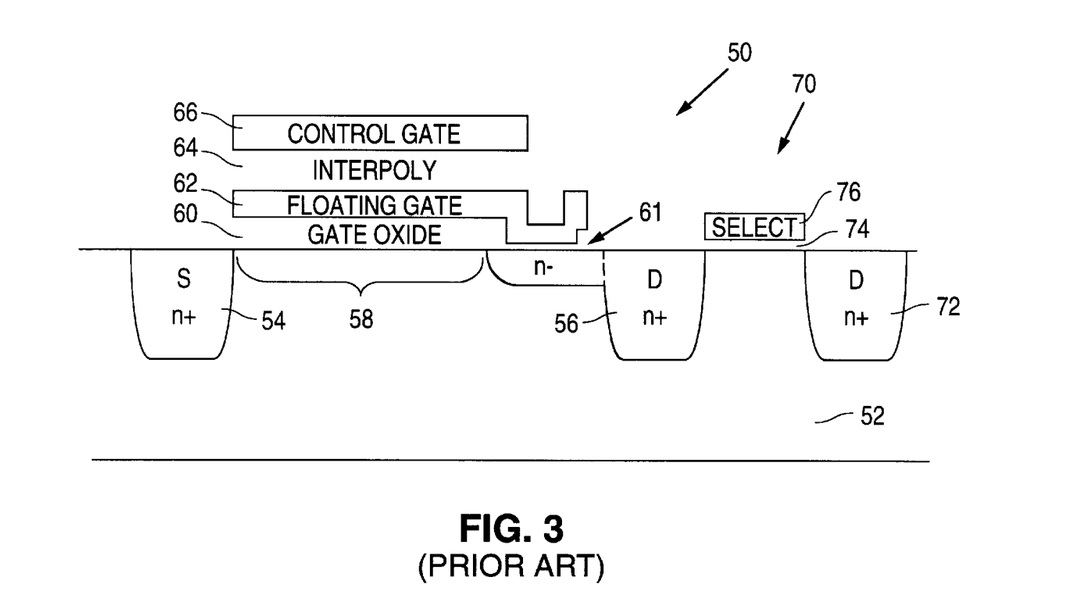
FIG. 3 is a cross-sectional view illustrating a conventional FLOTOX memory cell 50.

3, FLOTOX cell 50 includes spaced-apart n-type source and drain regions 54 and 56, respectively, which are formed in a p-type material 52, such as a well or substrate, and a channel-region 58 which is defined between source and drain regions 54 and 56.

In addition, cell 50 also includes a stacked gate structure that has a layer of gate oxide 60 and a small region of tunnel oxide 61 formed over channel region 58 and a portion of drain region 56, a floating gate 62 formed over gate oxide and tunnel oxide layers 60 and 61, an interpoly dielectric layer 64 formed over floating gate 62, and a control gate 66 formed over dielectric layer 64.

FLOTOX cell 50 further includes a select transistor 70 which has a drain region 72 formed in p-type material 52 a distance apart from drain region 56 (drain region 56 functions as the source region for select transistor 70), a layer of gate oxide 74 formed over p-type material 52 between drain regions 56 and 72, and a select gate 76 formed over gate oxide layer 74.

In operation, like FLASH cell 40, the threshold voltage of FLOTOX cell 50 is set to fall within the erased threshold voltage range, i.e., the logic "0" level, by utilizing Fowler-Nordheim tunneling. Thus, by applying 8 volts to drain region 72 and 12 volts to select gate 76 (which places approximately 8 volts on drain region 56), grounding p-type material 52 and control gate 66, and floating source region 54, electrons tunnel through oxide layer 61 from floating gate 62 to drain region 56.

However, unlike FLASH cell 40, the threshold voltage of FLOTOX cell 50 is raised to be within the programmed threshold voltage range by also utilizing Fowler-Nordheim tunneling. Thus, by applying approximately 12 volts to control gate 66, grounding p-type material 52, and floating source region 54 and drain region 72, electrons will tunnel through oxide layer 61 from drain region 56 to floating gate 62, thereby raising the threshold voltage of FLOTOX cell 50.

Historically, the density of EPROM, FLASH and FLOTOX memory arrays has been increased by reducing the feature sizes of the cells. As the feature sizes become ever smaller, however, this approach is becoming more costly and more difficult to implement.

Another approach to increasing the density of EPROM, FLASH and FLOTOX memory arrays is to set the threshold voltages of the cells to fall within one of a plurality of programmed threshold voltage ranges. Thus, rather than setting the threshold voltage to fall within a single programmed threshold voltage range, the threshold voltage can be set, for example, to fall within a first, second, or third programmed threshold voltage range.

In this example, the erased threshold voltage range can represent a logic state "00", while the first, second, and third threshold voltage ranges can represent logic states "01", "10", and "11", respectively. Thus, if each memory cell could store four logic levels, i.e., a logic "00", "01", "10", or "11", then the density of an EPROM, FLASH, or FLOTOX array could be doubled without changing the physical size of the array.

One technique for storing more than two logic states in EPROM, FLASH, and EEPROM cells is to vary the length of time utilized to raise the threshold voltage. Thus, for example, if the biasing voltages are applied for a first, second, or third time period, a first, second, or third number of electrons, respectively, will be injected onto the floating gate. The first, second, and third numbers of electrons, in turn, correspond with threshold voltages which fall within the first, second, and third threshold voltage ranges.

The problem with this approach, however, is that it is difficult to precisely control the number of electrons that are injected onto the floating gate. As a result, memory arrays which employ this approach typically utilize a continuous program and read sequence to control the number of injected electrons.

With a continuous program and read sequence, a short duration programming pulse is first applied to the cell. Following this, the cell is read to determine the threshold voltage of the cell. This process then continues until the read step indicates that the threshold voltage has reached the desired threshold voltage range.

Although the continuous program and read sequence provides a method for storing more than two logic states, the process requires additional control circuitry and significantly extends the time required to program a cell. Thus, there is a need for a method that sets the threshold voltage of a cell to one of a plurality of programmed threshold voltage ranges without requiring multiple program and read steps.

SUMMARY OF THE INVENTION

Conventional FLASH and FLOTOX memory cells utilize a continuous program and read sequence to move the threshold voltage from an erased threshold voltage range to one of a plurality of programmed threshold voltage ranges. With the program and read sequence, the cell is continuously programmed and read until the read step verifies that the threshold voltage is within the desired threshold voltage range.

In the present invention, the threshold voltages of FLASH and FLOTOX memory cells are moved from an erased threshold voltage range to one of a plurality of programmed threshold voltage ranges by simply varying the voltage on the control gate.

The method of the present invention operates on a memory cell having spaced-apart source and drain regions formed in a substrate material, and a channel region defined between the source and drain regions. In addition, the cell also has a stacked gate structure that includes a layer of first insulation material formed over the channel region, and a floating gate formed over the layer of first insulation material. The stacked gate structure further includes a layer of second insulation material formed over the floating gate, and a control gate formed over the layer of second insulation material.

In accordance with the method of the present invention a plurality of threshold voltage ranges, which include a first threshold voltage range and a plurality of remaining threshold voltage ranges, are defined. The plurality of threshold voltage ranges, in turn, define a corresponding plurality of logic states.

The threshold voltage of the memory cell is set to fall within the first threshold voltage range which defines a first logic state of the plurality of logic states. The threshold voltage is changed to fall within one of the plurality of remaining threshold voltage ranges by applying a substrate voltage to the substrate material, a drain voltage to the drain region, and one of a plurality of programming voltages to the control gate, where each of the plurality of programming voltages corresponds to one of the plurality of remaining threshold voltage ranges.

A better understanding of the features and advantages of the present invention will be obtained by reference to the following detailed description and accompanying drawings which set forth an illustrative embodiment in which the principals of the invention are utilized.

DETAILED DESCRIPTION

Figure 4:
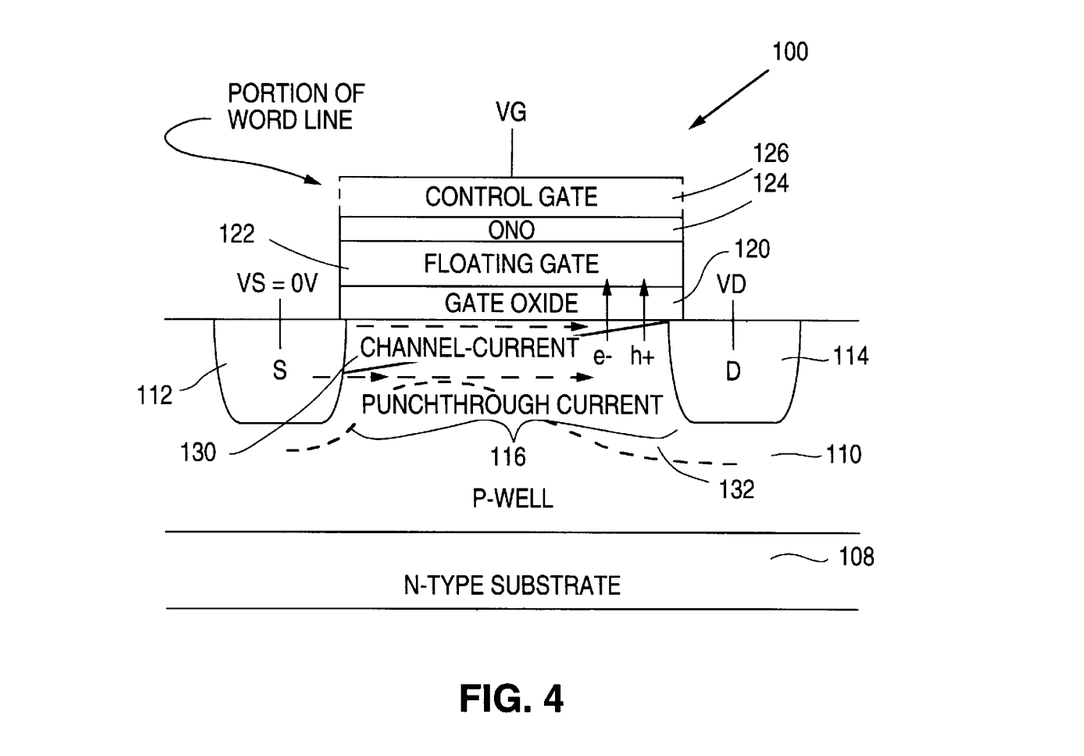
FIG. 4 is a cross-sectional drawing illustrating an n-channel, floating-gate memory cell 100 in accordance with the invention of the parent application.

FIG. 4 shows a cross-sectional drawing that illustrates an n-channel, floating-gate memory cell 100 in accordance with the invention of the parent application. As shown in FIG. 4, cell 100 is formed in a p-type well 110 which, in turn, is formed in an n-type substrate 108.

Memory cell 100 includes an n-type source region 112, an n-type drain region 114, and a channel region 116 formed between the source and drain regions 112 and 114. The channel region 116 is doped with p-type impurity atoms to adjust the threshold voltage of the cell.

In accordance with the invention of the parent application, cell 100 is formed to produce a punchthrough current during programming. The channel lengths and doping levels, as well as the bias conditions, which are required to produce a punchthrough current through channel region 116 are well known in the art.

With 0.6 micron technology, for example, cell 100 preferably utilizes a channel length of 0.5–0.7 microns and a doping concentration of 1–2×10$^{17}$ p-type atoms. When smaller micron technologies are utilized, the channel length and the doping concentration can be reduced accordingly. Thus, for example, with 0.3 micron technology, cell 100 preferably utilizes a channel length of 0.2–0.4 microns and a doping concentration of 5×10$^{17}$ p-type atoms.

As further shown in FIG. 4, memory cell 100 also includes a first insulation layer 120 formed over channel region 116, a floating gate 122 formed over insulation layer 120, a second insulation layer 124 formed over floating gate 122, and a control gate 126 (a portion of word line WL) formed over insulation layer 124.

In accordance with the invention of the parent application, memory cell 100 is programmed to store one of three or more logic levels by maintaining an equilibrium across the source-to-well junction, reverse-biasing the drain-to-well junction, and applying one of a corresponding three or more programming voltages to control gate 126 during programming.

With 0.6 micron technology, memory cell 100 preferably utilizes a drain voltage that is 4–7 volts greater than the well voltage. In addition, although other voltages can be utilized, well 110 and source 112 are preferably grounded.

As above, when smaller micron technologies are utilized, the preferred conditions can be reduced accordingly. Thus, for example, with 0.3 micron technology, cell 100 preferably utilizes a drain voltage which is 2–4 volts greater than the well voltage.

In operation, when one of the programming voltages is applied to control gate 126, a positive potential is induced on floating gate 122 which, in turn, attracts electrons from the doped p-type atoms in channel region 116 to the surface of well 110 to form a channel 130. This potential also repels holes from the doped impurity atoms and forms a depletion region 132.

When the source and drain voltages are applied, an electric field is established between the source and drain regions 112 and 114. The electric field, as with conventional programming, accelerates the electrons in channel 130 which, in turn, have ionizing collisions that form channel hot electrons. The positive potential on floating gate 122 attracts these channel hot electrons which penetrate insulation layer 120 and begin accumulating on floating gate 122.

In addition to the formation of channel hot electrons, the invention of the parent application utilizes the punchthrough current to form substrate hot electrons which also collect on floating gate 122. In operation, due to the relatively short channel length, i.e., 0.5 microns in a 0.6 micron process, the electric field reduces the potential energy barrier at the source-to-well junction. The reduced potential energy barrier allows more majority carriers in source 112 to overcome the barrier which, in turn, produces the punchthrough current across the source-to-well junction.

As the electrons associated with the punchthrough current near drain 114, the electric field accelerates the electrons which, in turn, also have ionizing collisions that form substrate hot electrons. The positive potential on floating gate 122 also attracts these substrate hot electrons which penetrate insulation layer 120 and begin accumulating on floating gate 122.

However, unlike conventional floating-gate programming, the flow of electrons generated by the punchthrough current does not depend on the existence of a channel or the relative positive charge on floating gate 122. As a result, the electrons associated with the punchthrough current continue to accumulate on floating gate 122 after channel 130 has been turned off.

Thus, cell 100 is programmed by utilizing both channel hot electrons and substrate hot electrons to change the potential on floating gate 122. As a result of utilizing two sources of hot electrons, a significantly lower control gate voltage can be used during programming than is conventionally used to program a cell because fewer channel hot electrons need to be attracted to floating gate 122.

Figure 5:
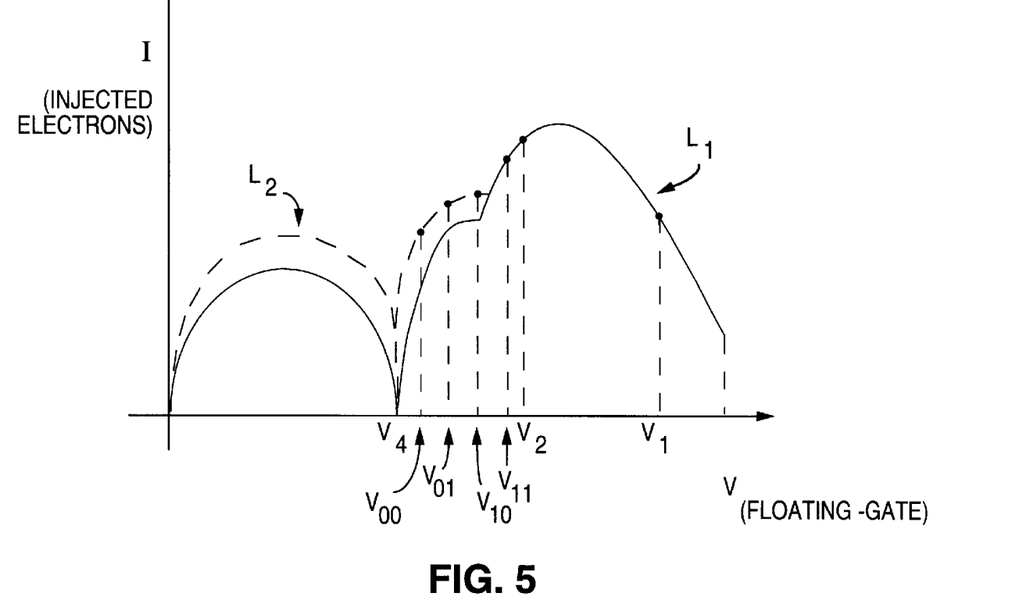
FIG. 5 is a graphical representation illustrating a cell programming characterization curve.

FIG. 5 shows a graphical representation that illustrates a cell programming characterization curve. As shown by lines $L_1$ and $L_2$ in FIG. 5, the voltage (V) on the floating gate influences the number of hot electrons (I) that are injected onto the floating gate.

Conventionally, the primary consideration in programming erased memory cells is the time required to place a defined amount of negative charge on the floating gate of the cell. As a result, the typical memory cell is designed to utilize an initial floating gate voltage $V_1$ and a final floating gate voltage $V_2$ that are positioned on opposite sides of the peak of curve $L_1$ shown in FIG. 5, thereby taking advantage of the maximum injection of hot electrons onto the floating gate. As described, the initial floating gate voltage $V_1$ represents the voltage capacitively coupled to the floating gate from the control gate, while the final floating gate voltage $V_2$ represents the initial voltage $V_1$ reduced by the accumulated negative charge.

Figure 6:
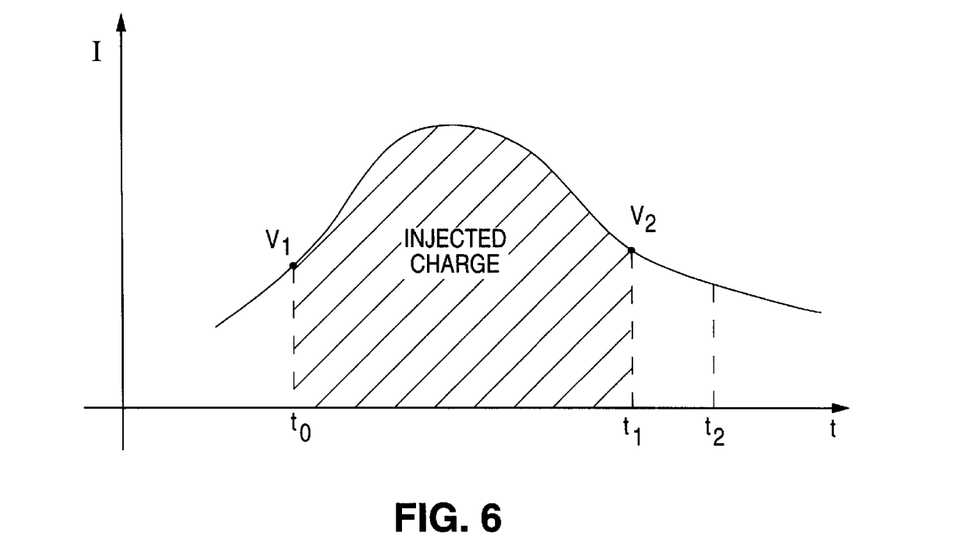
FIG. 6 is a graphical representation illustrating the current and the amount of negative charge injected onto the floating gate for initial and final floating-gate voltages $V_1$ and $V_2$.

FIG. 6 shows a graphical representation that illustrates the amount of negative charge injected onto the floating gate for initial and final voltages $V_1$ and $V_2$. As shown in FIG. 6, the amount of charge injected on the floating gate can be determined by integrating under the curve from the initial voltage $V_1$ at time $t_0$ to the final voltage $V_2$ at time $t_1$.

More importantly, however, FIG. 6 illustrates that any variation in the timing will cause a greater or lesser amount of negative charge to be injected onto the floating gate. Thus, for example, if the programming is terminated at time $t_2$ rather than time $t_1$, a greater amount of charge will be injected.

With conventional programming, this additional (or lesser) amount of negative charge does not present any problems because the cell is only being programmed to one of two logic levels. Thus, as long as the cell is programmed to have a minimum amount of charge, any additional charge is acceptable.

However, with multi-level programming, the accumulation of additional negative charge makes it difficult to determine which logic level is represented by the charge. Thus, to insure that the charge is within a defined threshold voltage range, the timing must be precisely controlled. This timing, however, is very difficult to control.

The invention of the parent application achieves multiple levels of injected charge by utilizing one of a plurality of initial voltages. Since the initial voltages are defined by the voltage capacitively coupled to the floating gate from the control gate, the initial voltages are selected by selecting one of a plurality of control voltages.

For example, referring again to FIG. 5, voltage $V_{00}$, $V_{01}$, $V_{10}$, or $V_{11}$ may be selected as the initial voltage by selecting a corresponding control gate voltage. As further shown in FIG. 5, the present invention utilizes voltage $V_4$ as the final voltage. The significance of utilizing voltage $V_4$ as the final voltage can be seen in FIG. 7.

Figure 7:
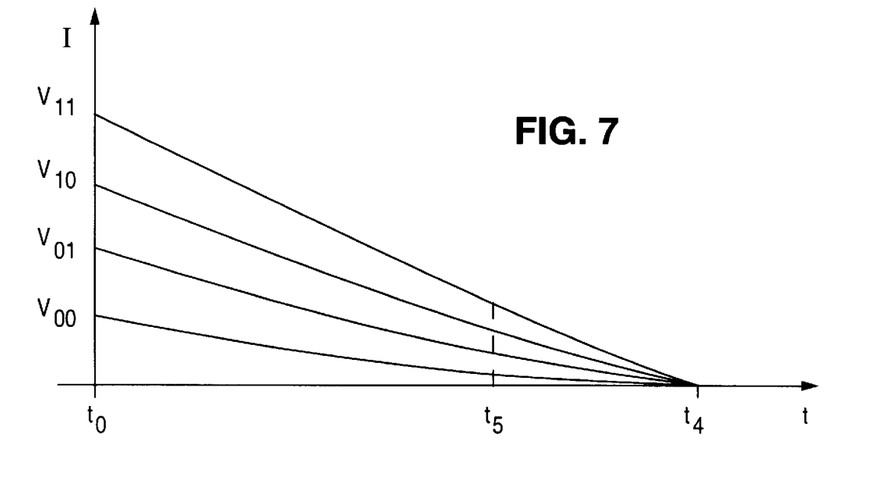
FIG. 7 is a graphical representation illustrating the current of negative charge injected onto the floating gate for initial floating-gate voltages $V_{00}$–$V_{11}$ and final voltage $V_4$.

FIG. 7 shows a graphical representation that illustrates the amount of negative charge injected onto the floating gate for initial voltages $V_{00}$–$V_{11}$ and final voltage $V_4$. As shown in FIG. 7, the amount of negative charge injected on the floating gate can be determined by integrating under the curve from each of the initial voltages $V_{00}$–$V_{11}$ at time $t_0$ to the final voltage $V_4$ at time $t_4$.

FIG. 7, however, also illustrates that because the injected charge converges towards zero for each initial voltage $V_{00}$–$V_{11}$, the injected charge is largely insensitive to timing variations. Thus, the floating gate can still have one of a plurality of discrete levels of injected charge if programming is terminated anytime between time $t_4$ and $t_5$ because the amount of additional charge during this time is so small.

One drawback of the approach, as described, is that the magnitude of the injected current drops as the voltage on the floating gate approaches the final voltage $V_4$ (see FIG. 5). As a result, it takes a greater amount of time to program the cell.

In accordance with the invention of the parent application, however, line L1 of FIG. 5 can be altered, as shown by line L2, by increasing the formation of substrate hot electrons as described above. Thus, although the time required to program a memory cell in accordance with the invention of the parent application remains longer than conventional programming, the formation of substrate hot electrons substantially narrows the time difference.

Figure 8:
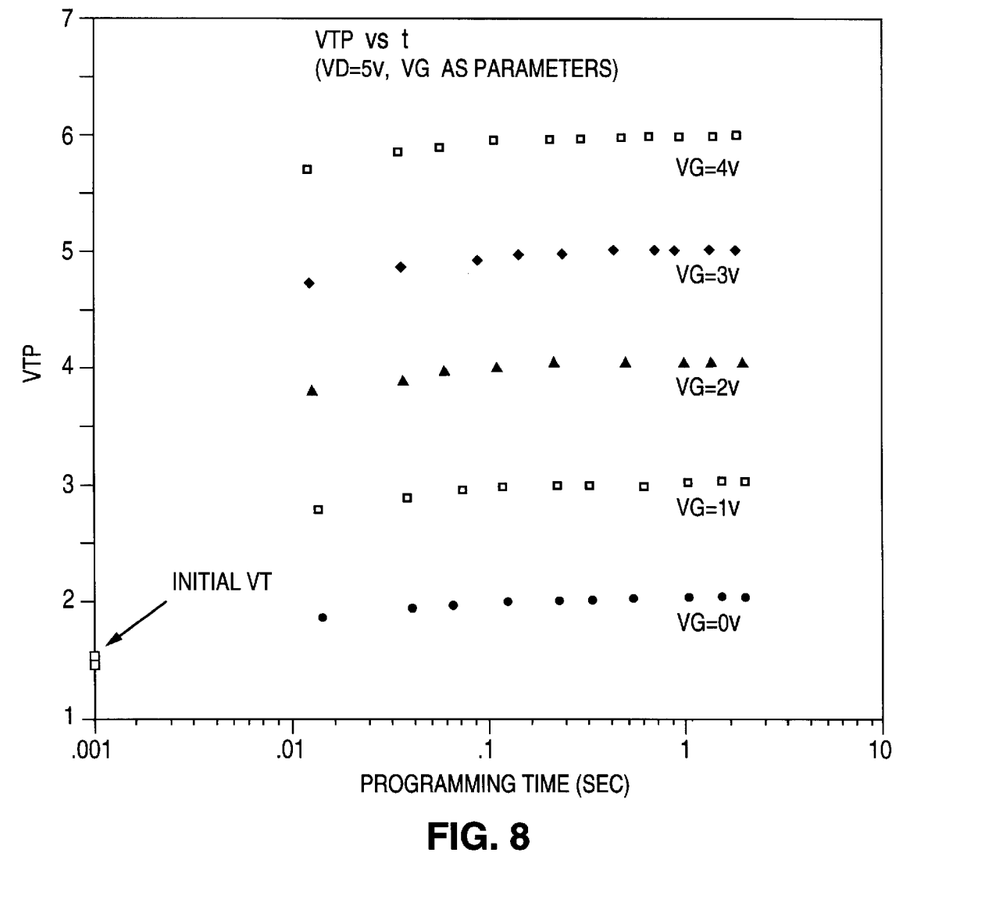
FIG. 8 is a graphical representation illustrating a series of experimental results.

FIG. 8 shows a graphical representation that illustrates a series of experimental results. As shown in FIG. 8, when one volt was applied to the control gate, the charge on the floating gate converged to a threshold voltage of approximately three volts from an initial threshold voltage of 1.5 volts within 50 milliseconds or less. Similarly, when two, three, and four volts were applied to the control gate, the charge on the floating gate converged to threshold voltages of approximately four, five, and six volts, respectively, within 50 milliseconds or less. Although an initial threshold voltage of 1.5 volts was utilized in the above experiment, any initial threshold voltage after erase may be utilized.

Since the charge on the floating gate converges to a stable value which corresponds to a defined threshold voltage within 50 milliseconds or less, a single floating gate memory cell can be programmed to have one of a plurality of threshold voltages by applying the corresponding voltage to the control gate during programming. As a result, a single floating gate memory cell can be utilized to store two or more bits of data.

For example, a 0-0 could be represented by a threshold voltage of 3 volts, while a 0-1 could be represented by a threshold voltage of 4 volts. Similarly, a 1-0 could be represented by a threshold voltage of 5 volts, while a 1-1 could be represented by a threshold voltage of 6 volts.

As further shown in FIG. 8, the experimental results also show that changes in the control gate voltage are linearly related to changes in the threshold voltage, i.e., a one volt increase in the control gate voltage increases the threshold voltage by one volt. As a result, memory cell 100 is not limited to representing two bits, but can represent any number of bits depending on the sensitivity of the current sense detectors utilized to discriminate one threshold voltage from another. Furthermore, even a continuous analog level can be stored in a cell as a threshold voltage.

For example, a 0-0-0 could be represented by a threshold voltage of 3 volts, while a 0-0-1 could be represented by a threshold voltage of 3.5 volts. Similarly, a 0-0-0-0 could be represented by a threshold voltage of 3 volts, while a 0-0-0-1 could be represented by a threshold voltage of 3.25 volts.

In the preferred embodiment, the dimensions of cell 100, as well as the bias voltages, are selected to optimize the formation of the punchthrough current. Alternately, less punchthrough current than is optimally obtainable can also be utilized. The result of utilizing less punchthrough current, however, is that it takes more time, i.e., greater than 50 milliseconds, for the charge on the floating gate to converge to the desired threshold voltage.

Thus, as described above, when an equilibrium condition is maintained across the source-to-well junction, and the drain-to-well junction is reverse-biased, cell 100 can be programmed to store three or more logic levels by applying one of a corresponding three or more programming voltages to the control gate (word line).

As stated above, one advantage of the present invention is that the memory cell 100 can be programmed to store multiple bits of data by utilizing a programming voltage that is considerably less than the programming voltage typically used, i.e., less than five volts in the present invention compared to the approximately 12 volts that are typically used. In addition to providing a substantial power savings for low power applications, such as notebook computers, the invention of the parent application eliminates the need to form charge pumps on memory chips to produce the programming voltage, i.e., the 12 volts.

As is well known, charge pumps can consume a significant area, i.e., up to 30% of the total die area of a memory chip. Thus, by eliminating the need for charge pumps, the invention of the parent application significantly reduces the area required for a memory cell, and therefore the cost of a memory.

The elimination of high programming voltages also leads to an increase in the density of an array of cells because less isolation is required between both memory cells and the peripheral circuitry. Conventionally, punchthrough current is considered undesirable. In 0.6 micron technology, the minimum channel length that can be obtained without inducing a punchthrough current during normal functioning is approximately 0.6 microns.

However, since the invention of the parent application utilizes punchthrough current, a 0.6 micron channel length limitation no longer applies. In 0.6 micron technology, punchthrough current can be obtained without breaking down the cell by utilizing channel lengths in the range of approximately 0.4 to 0.6 microns. As a result, the invention of the parent application substantially reduces the size of an array of cells, thereby increasing the density of the array.

Figure 1:
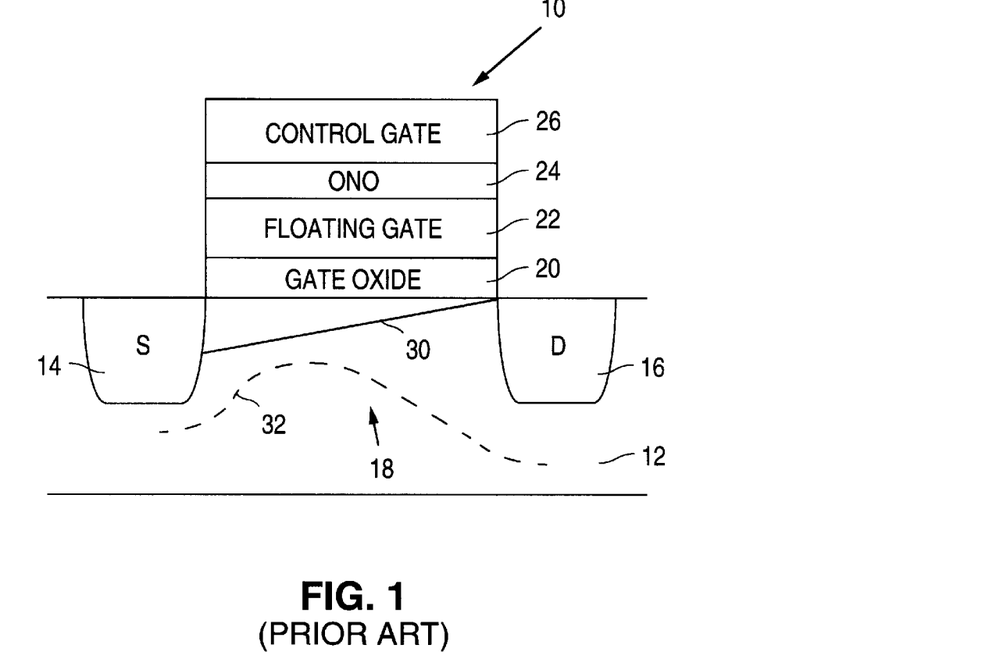
FIG. 1 is a cross-sectional view illustrating a conventional EPROM memory cell 10.
Figure 2:
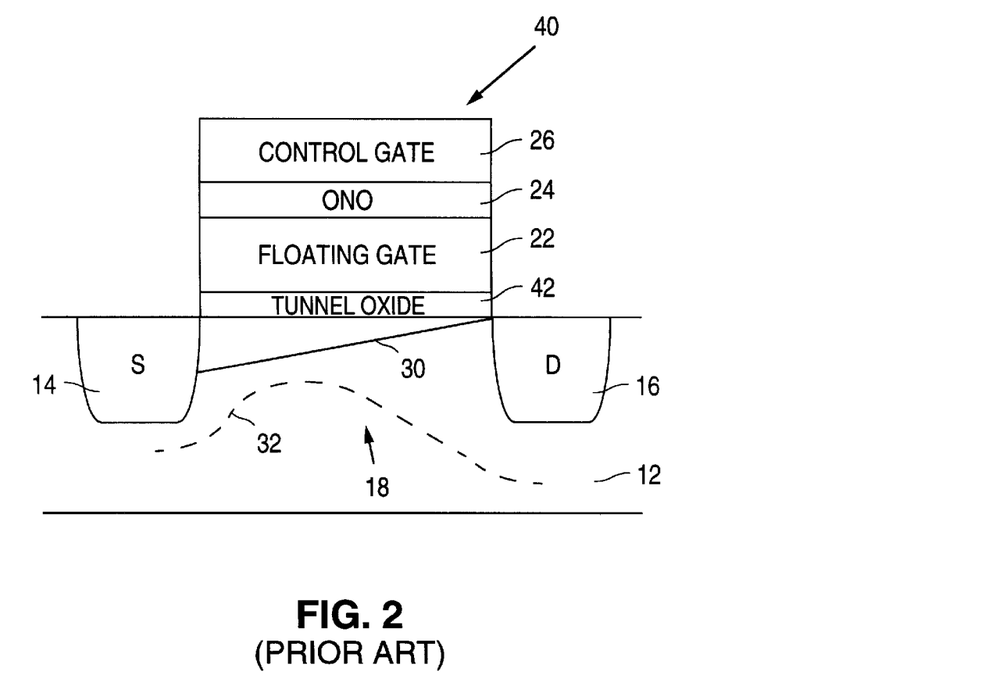
FIG. 2 is a cross-sectional view illustrating a conventional FLASH memory cell 40.
Figure 9:
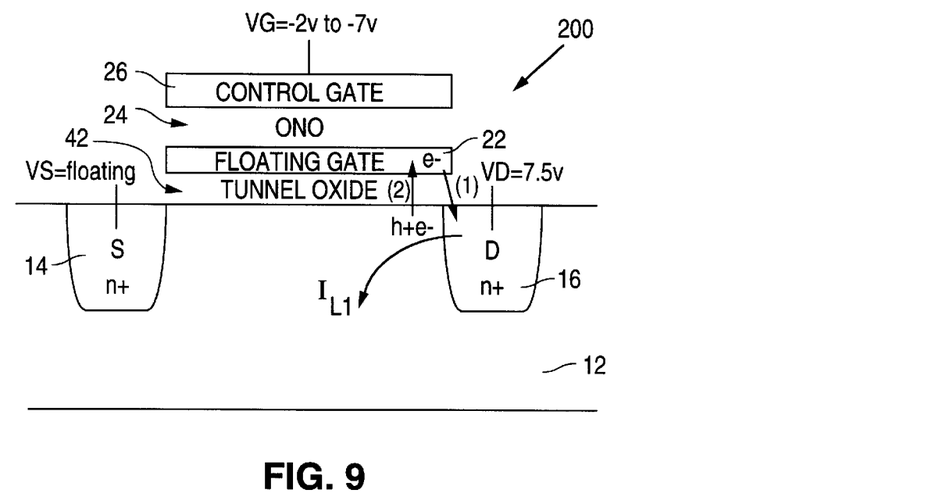
FIG. 9 is a cross-sectional view illustrating a FLASH memory cell 200 in accordance with the present invention.

Turning now to the present invention, FIG. 9 shows a cross-sectional view that illustrates a FLASH memory cell 200 in accordance with the present invention. FLASH cell 200 is structurally similar to FLASH cell 40 of FIG. 2 and, as a result, utilizes the same reference numerals to designate the structures which are common to both cells.

In contrast with the previous method, where the threshold voltage was first set to fall within a low threshold voltage range, such as 2 volts or less, where relatively few electrons are on the floating gate, the present method begins by setting the threshold voltage to fall within a high threshold voltage range, such as 5 volts or more, where a very large number of electrons are on the floating gate.

The threshold voltage of FLASH cell 200 is raised to be within the high threshold voltage range by utilizing conventional channel-hot electron injection. Alternately, the punchthrough current of memory cell 100 can also be used to raise the threshold voltage of cell 200.

Once the threshold voltage has been raised to be within the high threshold voltage range, which represents the erased threshold voltage range, the threshold voltage of memory cell 200 is lowered to fall within one of a plurality of programmed threshold voltage ranges by applying one of a corresponding plurality of programming voltages to control gate 26, such as −3, −4, and −5 volts.

The programming voltage applied to control gate 26, in turn, is capacitively coupled to floating gate 22. Thus, by applying one of a plurality of programming voltages to control gate 26, one of a plurality of initial potentials is induced on control gate 22.

In addition to applying one of the programming voltages, a positive voltage, such as 7.5 volts, is applied to drain region 16, a negative voltage, such as −0.5 volts, is applied to p-type material 12 to create a reverse-bias across the drain-to-well/substrate junction of approximately 8 volts, while source 14 is floated.

Figure 10:
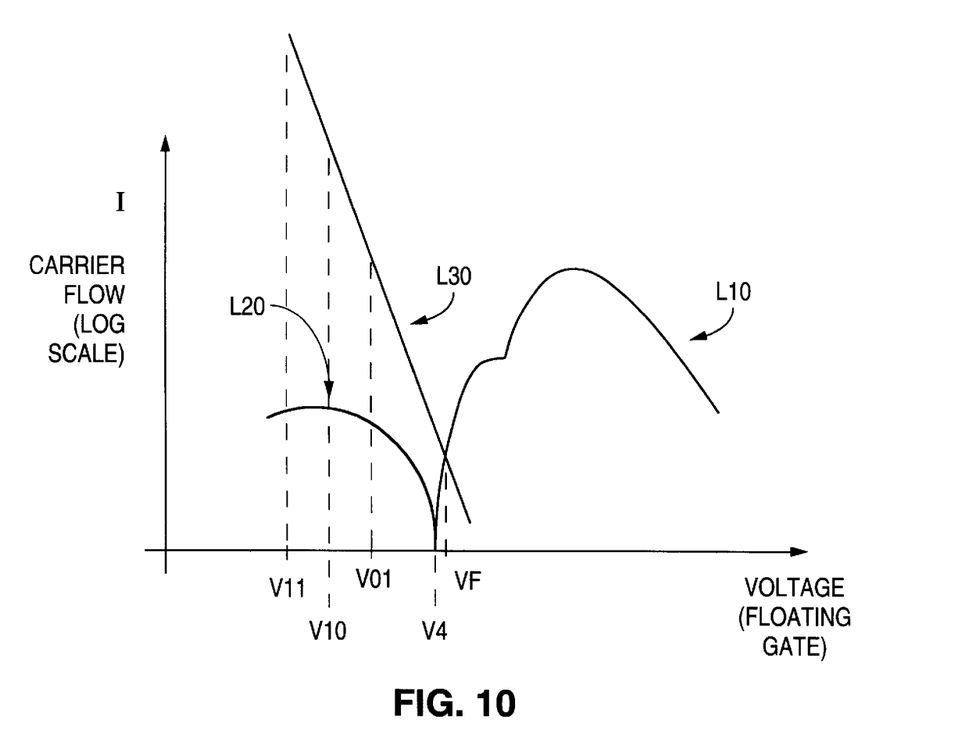
FIG. 10 is a graphical representation illustrating the operation of FLASH cell 200 in accordance with the present invention.

FIG. 10 shows a graphical representation that illustrates the operation of FLASH cell 200 in accordance with the present invention. As shown in FIG. 10, when a first negative voltage, such as −3 volts, is applied to control gate 26, an initial potential of V01 is induced on floating gate 22.

Similarly, when second and third negative voltages, such as −4 and −5 volts, respectively, are applied to control gate 26, corresponding second and third potentials V10 and V11, respectively, are induced on floating gate 22. Thus, when one of a plurality of programming voltages is applied to control gate 26, one of a plurality of initial potentials is induced on control gate 22.

As further shown in FIG. 10, line L10 represents hot electron injection, line L20, which intersects line L10 at potential V4, represents hot hole injection, and line L30, which intersects line L10 at potential VF, represents Fowler-Nordheim erasure.

Thus, in operation, when the other bias conditions are applied, electrons tunnel through oxide layer 42 from floating gate 22 to drain region 16 via Fowler-Nordheim tunneling as shown by line L30.

In addition, as described in greater detail below, hot holes are also injected onto floating gate 22 as shown by line L20. In the present invention, the bias conditions are selected so that many more electrons are removed from floating gate 22 via Fowler-Nordheim erasure, as shown by line L30, than hot holes are injected as shown by line L20. Hot hole injection is undesirable due to hole trapping and reliability concerns.

As a result of the bias conditions, the potential on floating gate 22 rises while the threshold voltage drops due to the reduced number of electrons and the increased number of holes. As the floating gate potential continues to increase, the flow of electrons leaving floating gate 22 due to Fowler-Nordheim tunneling decreases, the injection of hot holes onto floating gate 22 substantially decreases, and the injection of hot electrons onto floating gate 22 increases.

Thus, as shown in FIG. 10, when the floating gate potential increases to potential V4, the injection of hot holes is substantially balanced by the injection of hot electrons.

The hot electrons continue to be injected onto floating gate 22 until the incoming flow of hot electrons balances the outgoing flow of Fowler-Nordheim electrons (and the very low flow of incoming hot holes). As a result, the potential on floating gate 22 converges to a stable final potential VF, as shown by the intersection of lines L10 and L30, which is independent of the magnitudes of the biasing voltages. Thus, at potential VF, the carrier flows onto and off of floating gate 22 are balanced.

Turning again to FIG. 9, the hot electrons and holes are formed as a result of the voltage drop across the reverse-biased drain-to-well/substrate junction. Thermally and otherwise generated electron-hole pairs in the transition region are accelerated by the electric field into having ionizing collisions.

The ionizing collisions create hot electrons and holes that form an avalanche current $I_{L1}$ via the avalanche effect that flows from drain region 16 to p-type material 12. Since the potential on floating gate 22 begins very low, hot holes are initially attracted to floating gate 22. However, once the potential on floating gate 22 increases, the number of hot holes attracted to floating gate 22 decreases while the number of hot electrons attracted to floating gate 22 increases.

Figure 11:
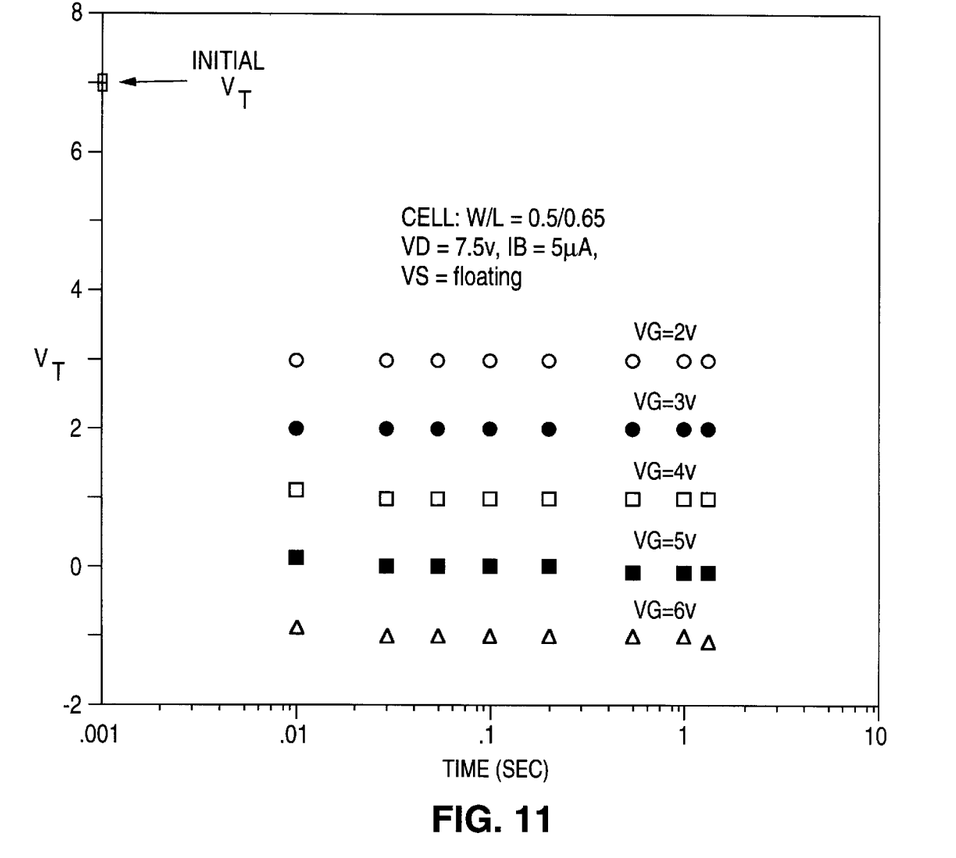
FIG. 11 is a graphical representation further illustrating the operation of FLASH cell 200 in accordance with the present invention.

FIG. 11 shows a graphical representation that further illustrates the operation of FLASH cell 200 in accordance with the present invention. As shown in FIG. 11, when −3 volts is applied to control gate 26, which causes the potential on floating gate 22 to increase from the initial potential of V01 to the final potential VF, the threshold voltage is lowered from approximately 7 volts to approximately 2 volts.

Similarly, when −4 and −5 volts are applied to control gate 26, which causes the potential on floating gate 22 to increase from initial potentials V10 and V11, respectively, to final potential VF, the threshold voltages are lowered from approximately 7 volts to approximately 1 and 0 volts, respectively.

As shown in FIG. 10, when −4 volts is applied to control gate 26, more electrons are removed from floating gate 22 as the floating gate potential moves from initial potential V10 to final potential VF than when −3 volts is applied to control gate 26 and the floating gate potential moves from initial potential V01 to final potential VF. As a result, as shown in FIG. 11, the threshold voltage that results from the application of −4 volts is less than the threshold voltage that results from the application of −3 volts.

Similarly, when −5 volts is applied to control gate 26, more electrons are removed as the floating gate potential moves from initial potential V11 to final potential VF than when −4 volts is applied to control gate 26 and the floating gate potential moves from initial potential V10 to final potential VF. As a result, the threshold voltage that results from the application of −5 volts is less than the threshold voltage that results from the application of −4 volts.

Thus, the threshold voltage of a FLASH memory cell can be lowered to fall within one of a plurality of threshold voltage ranges by simply applying the corresponding voltage to the control gate during programming.

For example, a 0-0 could be represented by a threshold voltage of 7 volts, while a 0-1 could be represented by a threshold voltage of 2 volts. Similarly, a 1-0 could be represented by a threshold voltage of 1 volt, while a 1-1 could be represented by a threshold voltage of 0 volts.

As further shown in FIG. 11, changes in the control gate voltage are linearly related to changes in the threshold voltage, i.e., a one volt decrease in the control gate voltage lowers the threshold voltage by one volt. As a result, the number of logic states that can be held by memory cell 200 is only limited by the sensitivity of the current sense detectors utilized to discriminate one threshold voltage from another.

For example, a 0-0-1 could be represented by a threshold voltage of 2 volts, while a 0-1-0 could be represented by a threshold voltage of 1.5 volts. Similarly, a 0-0-0-1 could be represented by a threshold voltage of 2 volts, while a 0-0-1-0 could be represented by a threshold voltage of 1.75 volts. Furthermore, even a continuous analog level can be stored in a cell as a threshold voltage.

Figure 12:
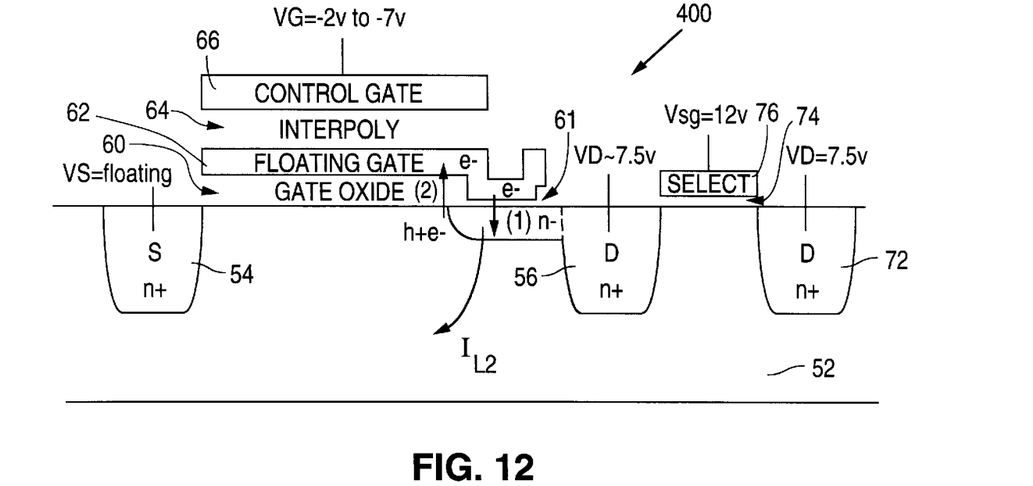
FIG. 12 is a cross-sectional view illustrating a FLOTOX memory cell 300 in accordance with the present invention.

Since Fowler-Nordheim tunneling is used, the process of the present invention applies equally well to FLOTOX memory cells. FIG. 12 shows a cross-sectional view that illustrates a FLOTOX memory cell 300 in accordance with the present invention. FLOTOX cell 300 is structurally similar to FLOTOX cell 50 of FIG. 3 and, as a result, utilizes the same reference numerals to designate the structures which are common to both cells.

As with FLASH cell 200, the threshold voltage of FLOTOX cell 300 is first set to fall within a high threshold voltage range, such as 5 volts or more, where a very large number of electrons are on the floating gate. The threshold voltage of FLOTOX cell 300 is raised to be within the high threshold voltage range by utilizing conventional Fowler-Nordheim tunneling injection.

Once the threshold voltage has been raised to be within the high threshold voltage range, which represents the erased threshold voltage range, the threshold voltage of memory cell 300 is lowered to fall within one of a plurality of programmed threshold voltage ranges by applying one of a corresponding plurality of programming voltages to control gate 26, such as −3, −4, and −5 volts.

In addition, a positive voltage, such as 12 volts, is applied to select gate 76, a positive voltage, such as 7.5 volts, is applied to drain region 72 (which places approximately 7.5 volts on drain region 56), a negative voltage, such as −0.5 volts, is applied to p-type material 52 to create a reverse-bias across the drain-to-well/substrate junction of approximately 8 volts, while source 54 is floated.

Under these bias conditions, electrons tunnel through oxide layer 61 from floating gate 62 to drain region 56 via Fowler-Nordheim tunneling, while hot holes are injected onto floating gate 62. As with FLASH cell 200, as the floating gate potential increases, the injection of hot holes substantially decreases, while the injection of hot electrons onto floating gate 62 increases to balance the declining Fowler-Nordheim flow of electrons. As a result, the potential on floating gate 62 also converges to a final stable potential.

As with FLASH cell 200, the hot electrons and holes are formed from ionizing collisions in the transition region which, in turn, form an avalanche current $I_{L2}$ via the avalanche effect that flows from drain region 72 to drain region 56 to p-type material 52.

Although the rate of hot electron and hole injection is slightly less in FLOTOX cell 300 than it is in FLASH cell 200 due to the thicker gate oxide of cell 300, FLOTOX cell 300 operates substantially the same as FLASH cell 200. As a result, the description of FLASH cell 200 with respect to FIGS. 10 and 11 applies equally to FLOTOX cell 300.

Figure 13A:
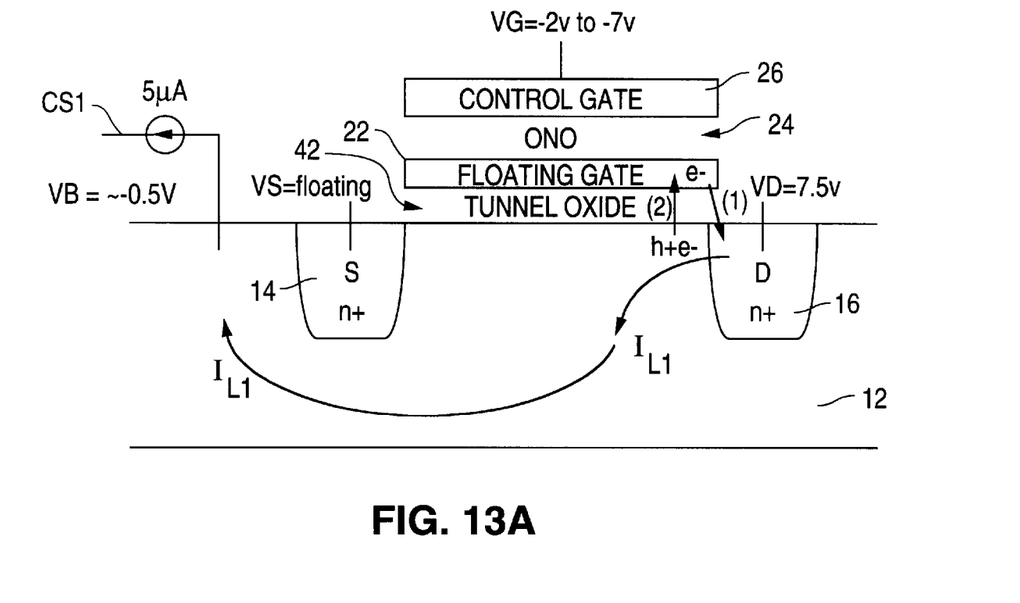
FIGS. 13A and 13B are cross-sectional views illustrating first and second alternative embodiments of FLASH memory cell 200 in accordance with the present invention.
Figure 13B:
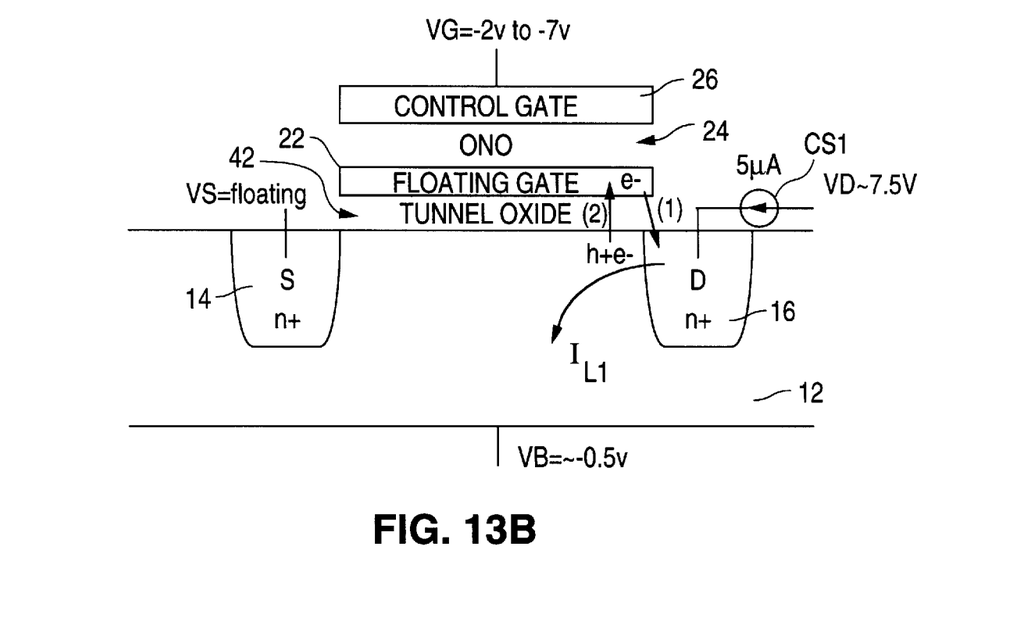

FIGS. 13A and 13B show cross-sectional views that illustrate first and second alternative embodiments of FLASH memory cell 200 in accordance with the present invention. As shown in FIGS. 13A and 13B, a current source CS1 is connected to p-type material 12 and drain region 16, respectively, to limit the magnitude of the avalanche current $I_{L1}$. Current source CS1 protects cell 200 from voltage spikes on drain region 16 which could substantially increase the magnitude of the avalanche current $I_{L1}$ and thereby damage cell 200.

Figure 14A:
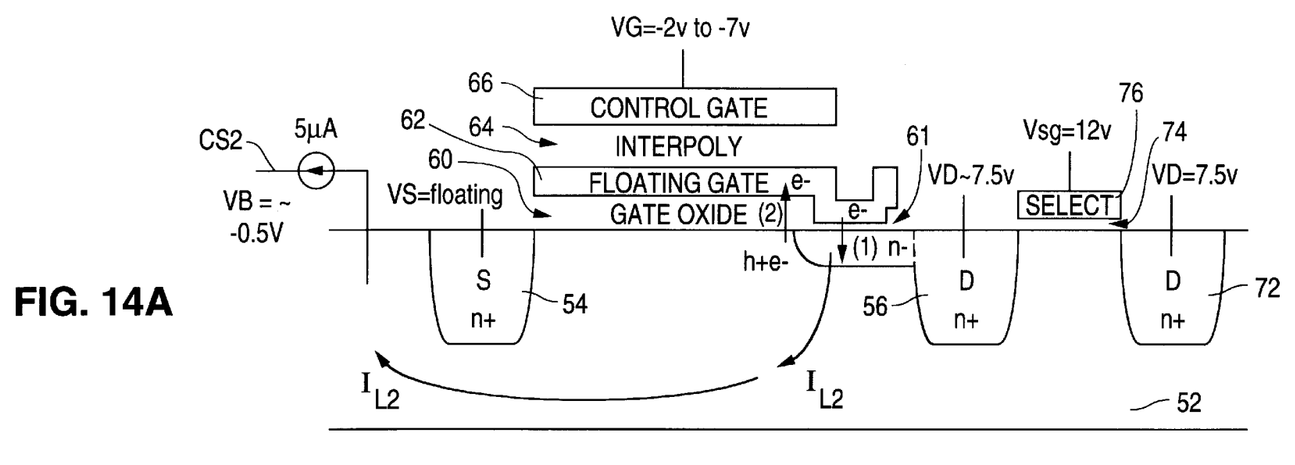
FIGS. 14A and 14B are cross-sectional views illustrating first and second alternative embodiments of FLOTOX memory cell 300 in accordance with the present invention.
Figure 14B:
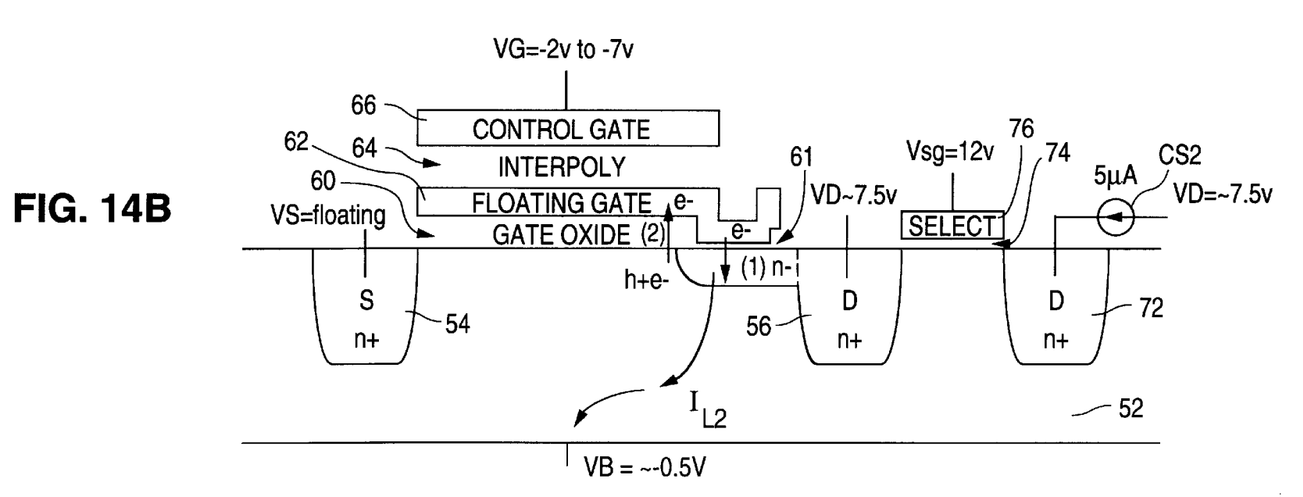

FIGS. 14A and 14B show cross-sectional views that illustrate first and second alternative embodiments of FLOTOX memory cell 300 in accordance with the present invention. As shown in FIGS. 14A and 14B, a current source CS2 is connected to p-type material 52 and drain region 72, respectively, to limit the magnitude of the leakage current $I_{L2}$. As with current source CS1, current source CS2 protects cell 300 from voltage spikes on drain region 72 which could substantially increase the magnitude of the leakage current $I_{L2}$ and thereby damage cell 300.

Figure 15:
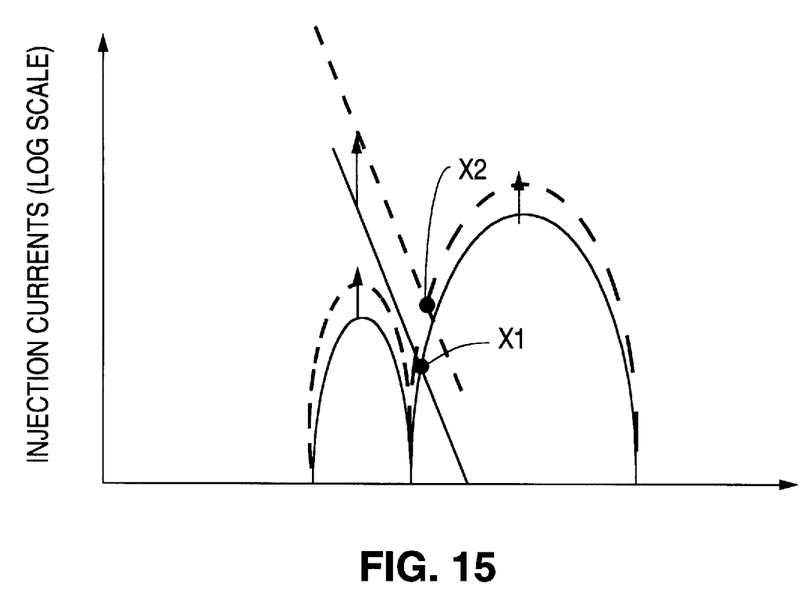
FIG. 15 is a graphical representation illustrating increased hot electron injection, hot hole injection, and Fowler-Nordheim erasure in accordance with the present invention.

FIG. 15 shows a graphical representation that illustrates increased hot electron injection, hot hole injection, and Fowler-Nordheim erasure. As shown in FIG. 15, by increasing hot electron injection and Fowler-Nordheim erasure, the cross-over point where lines L20 and L30 intersect is shifted from point X1 to point X2.

As a result, the flow of Fowler-Nordheim electrons and the flow of channel hot electrons are balanced with a larger electron flow which, in turn, increases the speed of convergence. Fowler-Nordheim tunneling can be increased by utilizing thinner tunnel oxide or by applying a higher drain voltage. Hot carrier injection can be increased by utilizing a larger avalanche current, or by increasing the reverse-bias across the drain-to-well/substrate junction.

Thus, a method has been described that moves the threshold voltage of FLASH and FLOTOX memory cells from an erased threshold voltage range to one of a plurality of programmed threshold voltage ranges.

It should be understood that various alternatives to the embodiment of the invention described herein may be employed in practicing the invention. For example, although the present invention has been described in terms of an n-channel memory cell, the present invention equally applies to a p-channel memory cell.

Thus, it is intended that the following claims define the scope of the invention and that methods and structures within the scope of these claims and their equivalents be covered thereby.

What is claimed is:

1. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states, the first threshold voltage range being higher than the plurality of remaining threshold voltage ranges;

setting a threshold voltage of the memory cell to fall within the first threshold voltage range, the first threshold voltage range defining a first logic state of the plurality of logic states; and changing the threshold voltage to fall within one of the plurality of remaining threshold voltage ranges after the threshold voltage has been set to fall within the first threshold voltage range by applying a substrate voltage to the substrate material, a drain voltage to the drain region, and one of a plurality of programming voltages to the control gate, each of the plurality of programming voltages corresponding to one of the plurality of remaining threshold voltage ranges.

2. The method of claim 1 wherein the threshold voltage is set to fall within the first threshold voltage range by injecting electrons onto the floating gate.

3. The method of claim 2 wherein electrons are injected onto the floating gate by forming channel hot electrons.

4. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states; and changing the threshold voltage to fall within one of the plurality of remaining threshold voltage ranges by applying a substrate voltage to the substrate material, a drain voltage to the drain region, and one of a plurality of programming voltages to the control gate, each of the plurality of programming voltages corresponding to one of the plurality of remaining threshold voltage ranges, the plurality of programming voltages being negative.

5. The method of claim 1 wherein a current flows from the drain region to the substrate material during programming.

6. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states;

changing the threshold voltage to fall within one of the plurality of remaining threshold voltage ranges by applying a substrate voltage to the substrate material, a drain voltage to the drain region, and one of a plurality of programming voltages to the control gate, each of the plurality of programming voltages corresponding to one of the plurality of remaining threshold voltage ranges;

sinking a current that flows from the drain region to the substrate material during programming with a current source connected to the substrate material; and limiting a magnitude of the current with the current source.

7. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states;

changing the threshold voltage to fall within one of the plurality of remaining threshold voltage ranges by applying a substrate voltage to the substrate material, a drain voltage to the drain region, and one of a plurality of programming voltages to the control gate, each of the plurality of programming voltages corresponding to one of the plurality of remaining threshold voltage ranges;

sourcing a current that flows from the drain region to the substrate material during programming with a current source connected to the drain region; and limiting a magnitude of the current with the current source.

8. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states; and changing the threshold voltage to fall within one of the plurality of remaining threshold voltage ranges by applying a substrate voltage to the substrate material, a drain voltage to the drain region, and one of a plurality of programming voltages to the control gate, each of the plurality of programming voltages corresponding to one of the plurality of remaining threshold voltage ranges wherein the substrate material is a well of a first conductivity type formed in a substrate of a second conductivity type.

9. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states; and changing the threshold voltage to fall within one of the plurality of remaining threshold voltage ranges by applying a substrate voltage to the substrate material, a drain voltage to the drain region, and one of a plurality of programming voltages to the control gate, each of the plurality of programming voltages corresponding to one of the plurality of remaining threshold voltage ranges, wherein when the substrate voltage, the drain voltage, and one of the programming voltages are applied, electrons flow from the floating gate to the drain region via Fowler-Nordheim tunneling.

10. The method of claim 9 wherein when the threshold voltage settles within one of the remaining threshold voltage ranges, the flow of electrons from the floating gate to the drain region is substantially balanced by a flow of electrons from the substrate material to the floating gate.

11. A method for programming a memory cell having spaced-apart source, first drain, and second drain regions formed in a substrate material, a first channel region defined between the source and first drain regions, a second channel region defined between the first and second drain regions, a layer of first insulation material formed over the first channel region having a thin portion and a thick portion, a floating gate formed over the layer of first insulation material, a layer of second insulation material formed over the floating gate, a control gate formed over the layer of second insulation material, a layer of third insulation material formed over the second channel region, and a select gate formed over the layer of third insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states; and changing the threshold voltage to fall within one of the plurality of remaining threshold voltage ranges by applying a substrate voltage to the substrate material, a select voltage to the select gate, a drain voltage to the second drain region, and one of a plurality of programming voltages to the control gate, each of the plurality of programming voltages corresponding to one of the plurality of remaining threshold voltage ranges.

12. The method of claim 11 wherein the first threshold voltage range is higher than the plurality of remaining threshold voltage ranges.

13. The method of claim 11 wherein the threshold voltage is set to fall within the first threshold voltage range by injecting electrons onto the floating gate.

14. The method of claim 13 wherein electrons are injected onto the floating gate via Fowler-Nordheim tunneling.

15. The method of claim 11 wherein the plurality of programming voltages are negative.

16. The method of claim 11 wherein a current flows from the first drain region to the substrate material during programming.

17. The method of claim 16 and further comprising a current source connected to the substrate material that sinks the current, and limits a magnitude of the current.

18. The method of claim 16 and further comprising a current source connected to the second drain region that sources the current, and limits a magnitude of the current.

19. The method of claim 11 wherein the substrate material is a well of a first conductivity type formed in a substrate of a second conductivity type.

20. The method of claim 11 wherein when the substrate voltage, the drain voltage, and one of the programming voltages are applied, electrons flow from the floating gate to the drain region via Fowler-Nordheim tunneling.

21. The method of claim 20 wherein when the threshold voltage settles within one of the remaining threshold voltage ranges, the flow of electrons from the floating gate to the drain region is substantially balanced by a flow of electrons from the substrate material to the floating gate.

22. A method for programming a memory cell having spaced-apart source and drain regions formed in a substrate material, a channel region defined between the source and drain regions, a layer of first insulation material formed over the channel region, a floating gate formed over the layer of first insulation material, a layer of second insulation material formed over the floating gate, and a control gate formed over the layer of second insulation material, the method comprising the steps of:

defining a plurality of threshold voltage ranges having a first threshold voltage range and a plurality of remaining threshold voltage ranges, the plurality of threshold voltage ranges defining a corresponding plurality of logic states;

setting a threshold voltage of the memory cell to fall within the first threshold voltage range, the first threshold voltage range defining a first logic state of the plurality of logic states; and changing the threshold voltage to fall within one of the plurality of remaining threshold voltage ranges after the threshold voltage has been set to fall within the first threshold voltage range by applying biasing voltages to the memory cell that cause the threshold voltage to settle to a voltage which is bounded by one of the remaining threshold voltage ranges, wherein carriers, defined as majority carriers in the drain region, are injected onto the floating gate, and removed from the floating gate, at the same time at a substantially equal rate when the threshold voltage settles to the voltage which is bounded by one of the remaining threshold voltage ranges.

23. The method of claim 22 wherein the first threshold voltage range is higher than the plurality of remaining threshold voltage ranges.

24. The method of claim 22 wherein the biasing voltages include a substrate voltage applied to the substrate material, a drain voltage applied to the drain region, and one of a plurality of programming voltages applied to the control gate.

25. The method of claim 24 wherein the plurality of programming voltages are negative.

* * * * *